United States Patent
Mamodia et al.

(10) Patent No.: US 10,499,461 B2
(45) Date of Patent: Dec. 3, 2019

(54) THERMAL HEAD WITH A THERMAL BARRIER FOR INTEGRATED CIRCUIT DIE PROCESSING

(71) Applicant: INTEL CORPORATION, Santa Clara, CA (US)

(72) Inventors: Mohit Mamodia, Chandler, AZ (US); Kyle Yazzie, Chandler, AZ (US); Dingying Xu, Chandler, AZ (US); Kuang Liu, Queen Creek, AZ (US); Paul J. Diglio, Chandler, AZ (US); Pramod Malatkar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 31 days.

(21) Appl. No.: 14/976,881

(22) Filed: Dec. 21, 2015

(65) Prior Publication Data
US 2017/0176516 A1    Jun. 22, 2017

(51) Int. Cl.
*G01R 31/28* (2006.01)
*H05B 3/26* (2006.01)

(52) U.S. Cl.
CPC ......... *H05B 3/267* (2013.01); *G01R 31/2867* (2013.01); *G01R 31/2875* (2013.01)

(58) Field of Classification Search
CPC ......... H01L 21/67103; H01L 21/67242; H01L 21/67248; H01L 21/683–6833; H05B 3/20–58; G01R 1/04; G01R 1/0433; G01R 1/0441; G01R 1/0458; G01R 31/26; G01R 31/2601; G01R 31/2851–2881
See application file for complete search history.

(56) References Cited

U.S. PATENT DOCUMENTS

| | | | | |
|---|---|---|---|---|
| 5,280,053 A | * | 1/1994 | Dearlove | C08K 3/08 428/413 |
| 6,340,895 B1 | * | 1/2002 | Uher | G01R 1/0491 324/750.05 |
| 6,468,098 B1 | * | 10/2002 | Eldridge | G01R 1/0735 439/197 |
| 7,544,251 B2 | * | 6/2009 | Holland | H01L 21/67103 118/724 |
| 8,193,573 B2 | * | 6/2012 | Bronner | G11C 16/3418 257/314 |
| 2002/0017916 A1 | * | 2/2002 | Costello | H01L 21/67109 324/750.09 |
| 2003/0153169 A1 | * | 8/2003 | Wang | H05K 3/025 438/586 |
| 2004/0227536 A1 | * | 11/2004 | Sugiyama | G01R 1/06705 324/750.03 |
| 2005/0215073 A1 | * | 9/2005 | Nakamura | H01L 21/67103 438/778 |
| 2006/0144516 A1 | * | 7/2006 | Ricci | H01L 21/67103 156/345.27 |
| 2006/0201918 A1 | * | 9/2006 | Awazu | H01L 21/67103 219/121.52 |

(Continued)

*Primary Examiner* — Huy Q Phan
*Assistant Examiner* — David B Frederiksen
(74) *Attorney, Agent, or Firm* — Schwabe, Williamson & Wyatt P.C.

(57) ABSTRACT

A thermal heat for integrated circuit die processing is described that includes a thermal barrier. In one example, the thermal head has a ceramic heater configured to carry an integrated circuit die, a metal base, and a thermal barrier between the heater and the base.

13 Claims, 3 Drawing Sheets

(56) References Cited

U.S. PATENT DOCUMENTS

| | | | | |
|---|---|---|---|---|
| 2008/0018352 | A1* | 1/2008 | Chiba | G01R 31/2865 324/750.04 |
| 2008/0257537 | A1* | 10/2008 | Hatta | G05D 23/1919 165/263 |
| 2008/0258316 | A1* | 10/2008 | Tamba | H01L 23/295 257/784 |
| 2009/0004317 | A1* | 1/2009 | Hu | C09K 5/14 425/352 |
| 2009/0160472 | A1* | 6/2009 | Segawa | H01L 21/67248 324/750.04 |
| 2009/0212418 | A1* | 8/2009 | Gurrum | H01L 23/293 257/717 |
| 2010/0007367 | A1* | 1/2010 | Spielberger | G01R 31/2875 324/762.03 |
| 2010/0014208 | A1* | 1/2010 | Tatsuhiko | C23C 14/50 361/234 |
| 2010/0039747 | A1* | 2/2010 | Sansoni | H01L 21/6833 361/234 |
| 2010/0271603 | A1* | 10/2010 | Bandoh | H01L 21/67248 355/30 |
| 2013/0171336 | A1* | 7/2013 | Cheng | H01L 21/68785 427/9 |
| 2013/0299133 | A1* | 11/2013 | Li | F25B 21/02 165/80.3 |
| 2014/0008880 | A1* | 1/2014 | Miura | H01L 21/6833 279/128 |
| 2014/0042716 | A1* | 2/2014 | Miura | H01L 21/67103 279/128 |
| 2014/0118880 | A1* | 5/2014 | He | H01L 21/6833 361/236 |
| 2014/0231815 | A1* | 8/2014 | Railkar | H01L 23/3735 257/76 |
| 2014/0263271 | A1* | 9/2014 | Sheelavant | H01L 21/67115 219/443.1 |
| 2015/0170990 | A1* | 6/2015 | Tseng | H01L 23/49816 257/712 |
| 2015/0228513 | A1* | 8/2015 | Parkhe | H01L 21/67103 219/444.1 |
| 2015/0276798 | A1* | 10/2015 | Song | G01R 1/04 324/750.08 |
| 2016/0020128 | A1* | 1/2016 | Wang | H01L 21/6833 361/234 |
| 2016/0035610 | A1* | 2/2016 | Park | H01L 21/6833 156/345.29 |

* cited by examiner

THERMAL HEAD WITH A THERMAL BARRIER FOR INTEGRATED CIRCUIT DIE PROCESSING

FIELD

The present disclosure relates to integrated circuit test using a thermal test or processing head and, in particular, to forming the thermal head.

BACKGROUND

In the manufacture of microelectronic devices, such as processors, controllers, and memory, the desired structures are formed on a wafer. Individual dies are cut from the wafer and then sealed into a package. The package has an array of pins, pads, or lands that make contact with the rest of the device, typically through a socket or a printed circuit board to allow the die to be operated while within the package. Before packaging, each die is tested to ensure that it has been manufactured and operates as intended. The dies may be tested while still part of the wafer or after dicing or both. After packaging, each package is tested to ensure that it has been manufactured correctly and operates as intended.

To perform the tests, a die which may or may not be packaged is placed on or attached to a thermal test head which controls the temperature of the die. The test head will have heaters and may also have cooling so that the die may be tested under extreme environmental circumstances. The die may also be heated to simulate a very high processing or operational load. The high and low heat not only stress the die but also stress the thermal test head. The stress comes not only from the extreme temperatures but from changing from a high to a low temperature.

High speed, controllable, and accurate test technologies provide greater reliability in the end product, higher factory throughput, and reduced manufacturing cost. High performance heating and cooling stages may be used for many different test processes. In addition, such stages may be used for manufacturing processes such as chip attach and thermal compression bonding.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

The thermal performance of existing heating and cooling stages may be improved with new materials. New materials with low thermal conductivity enable new designs that reduce thermal gradients.

Figure 1:
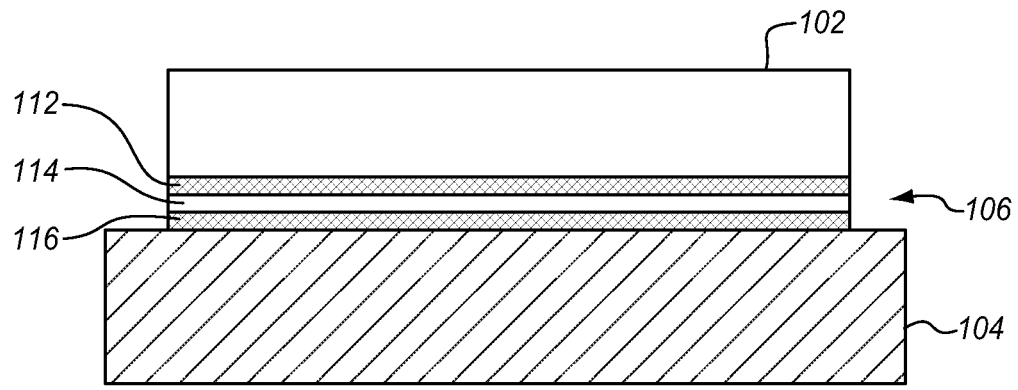
FIG. 1 is a cross-sectional side view diagram of a thermal stage with a thermal barrier according to an embodiment.

FIG. 1 is a cross-sectional side view diagram of a thermal stage as described herein that includes a ceramic heater plate 102 and a metal base plate 104 that are joined by a thermal barrier 106 comprising molded epoxy and adhesive. The thermal barrier may be formed of a very low CTE epoxy sheet 114, used as a thermal barrier application. The thermal sheet is bonded in between thermally conductive ceramic and metallic alloys using a liquid or film epoxy adhesive 112, 116. Surface modifications or treatments may be applied to the bonding interfaces to improve the adhesion. The improved adhesion allows the bond to survive mechanical stresses longer.

While the heater is described as being ceramic, the invention is not so limited. The heater may be made of other materials. In addition, the heater may also or alternatively be a cooler. In some embodiments, heater elements, such as resistive electric heater elements are embedded into or attached to the heater. In some embodiments fluid channels are formed in and through the heater. The fluid heats or cools the heater or both and the temperature of the fluid is controlled by an external heat exchanger. The heater elements and thermal fluid channels may be combined for more precise temperature control. Similarly, the base plate is described herein as being metal but may be made of any other suitable material.

The described low thermal conductivity materials are well suited to use as thermal barriers in high performance heating and cooling stages. The thermal barrier material may be bonded to some kind of high thermal conductivity heater, such as an AlN ceramic or a metal. The heater and thermal barrier may have different amounts of thermal expansion, thereby creating high shear and peel stresses that will try to delaminate the assembly. Therefore the thermal barrier material may have a high bond strength with the heater material and any other structural materials in the stack-up. High bond strengths help to prevent the heating and cooling stage from delaminating when operated.

The thermal barrier described herein may have an insulation layer that exhibits a high strength at high temperatures and a very low CTE (for example less than 15 ppm). This allows the insulation layer to survive the high and low thermal cycles that a thermal stage may be exposed to during operation. Polyimide is a suitable thermal insulation material with a very low CTE and a high strength even at higher temperatures. Materials used to construct a high performance heating and cooling stage, including the heater, the thermal barrier, and any base or pedestal, will all have slightly different amounts of, or coefficients of thermal expansion. High shear stresses will then develop at the bonded interfaces at extreme temperatures.

A variety of different thermal barrier materials may be used, depending on the particular implementation. In some implementations, the thermal head may be exposed to physical stress and processing chamber gases, such as fluorocarbon gases. In any implementation, a simple low cost application without significant surface preparation will lower costs.

Example 1: Epoxy-Based Thermal Barrier Bonded with an Epoxy-Based Adhesive

An epoxy-based adhesive provides a very high bond strength, almost as high as metalized or brazed surfaces. The high bond strength is in part due to bonding between two similar materials in that they are both epoxy-based. The thermal barrier is made out of epoxy mold compound, which is conventionally used for microelectronic packaging and not as a structural material. Epoxy mold compound can be a liquid which is cast or a solid which is melted and injection-molded.

In addition to thermal insulation and improved bond strength, this example also provides a chemically resistant solution for an insulator plate which is compatible with a variety of coolant fluid chemistries over long periods of exposure at high and at low temperatures. The epoxy adhesive can be in the form of an uncured sheet (i.e. pre-preg) or in the form of a dispensable liquid.

Example 2: Composite of Ceramic-Coated, or Ceramic-Filled Polyimide Thermal Barrier, Bonded with Epoxy This example enhances the adhesion of epoxy with a polyimide thermal barrier by using a polyimide coated with ceramic or filled with ceramic particles. Epoxy adheres strongly with ceramic materials, but has only moderate bond strength with polyimide. The polyimide-ceramic composite thermal barrier is resistant to brittle fracture, has the thermal insulating properties of polyimide, and has higher adhesion strength due to the ceramic filler particles. Ceramic coatings can be applied to various substrates, using magnetron sputtering.

An epoxy mold compound thermal barrier material bonded with epoxy-based adhesive has several times the strength of a polyimide thermal barrier material bonded with a similar epoxy-based adhesive. Very high strengths are established using AlN bonded with epoxy adhesive. The bond strengths between these materials can be leveraged to design mechanically robust, high performance heating and cooling stages.

Figure 2:
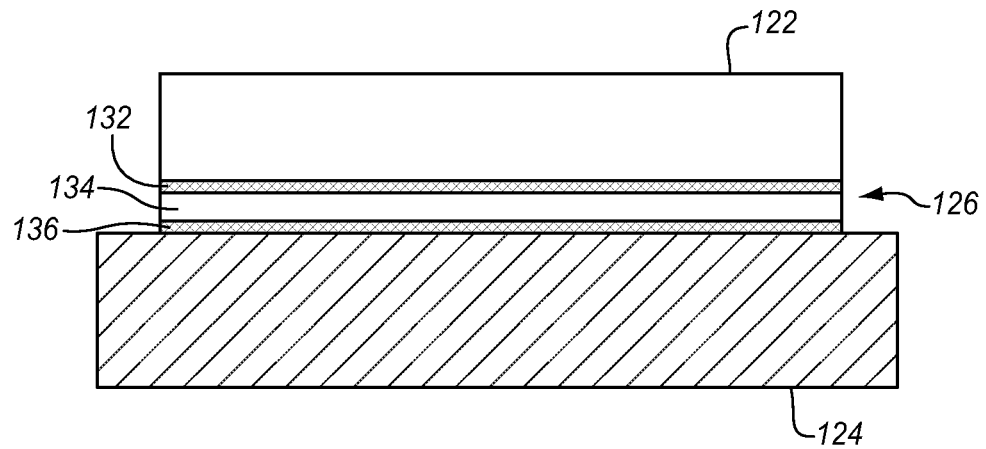
FIG. 2 is a cross-sectional side view diagram of a thermal stage with an alternative thermal barrier according to an embodiment.

In the embodiment of FIG. 2 described as example 4 above, the epoxy mold compound is used as a thermal barrier between a ceramic heater and a metal base. An epoxy adhesive joins the interfaces. A benefit of using epoxy mold compound is that it may be injection molded to create complex shapes, rather than requiring expensive machining.

An epoxy mold compound material may be used with aromatic or aliphatic chemistry and filled with silica fillers in order to achieve a low thermal conductivity, for example less than 1 W/mK and a low CTE, for example less than 12 ppm, and a high modulus.

After the epoxy mold compound is applied, it is then cured. Next, it may be exposed to a plasma, such as an $O_2$ plasma. This may increase the surface energy of the mold compound. The increased surface energy may then be used to improve the adhesion to the epoxy adhesive, which may be a film or liquid epoxy. The epoxy may then be cured again for further improved bond strength.

When the heater has ceramic or alloy surfaces these may be treated with a silane surface modification. The silane improves adhesion to the epoxy adhesive.

| Characteristic | Thermal Layer | Adhesive |
|---|---|---|
| Chemistry | Epoxy-Based Mold | Liquid or Film-based Epoxy Adhesive |
| Glass Transition Temp (Tg) | >150° C. | >150° C. |
| State at bonding | Solid (cured) | Liquid or Film (uncured) |
| Thickness | 0.1-2 mm | 10-100 μm |
| Post Cure CTE | <15 ppm | <40 ppm |
| Fillers, Reinforcement | Silica | Silica |
| Thermal Conductivity | <1 W/m · K | <1 W/mK |

Table of Material Specifications

As shown in the Table, very high bond strengths are provided by a three layer composite of epoxy mold compound (EMC) in two layers with epoxy in the middle. A very high bond strength is also obtained with AlN (ceramic) bonded with epoxy. Polyimide has excellent thermal insulating properties, but less adhesion strength even when used with epoxy.

As shown in FIG. 2, an alternative thermal insulator layer may be formed using a ceramic reinforced polyimide, which is bonded with a heater and a metal base plate using epoxy adhesive. In this cross-sectional side view diagram, a ceramic heater plate 122 is attached to a metal base plate 124 using an adhesive 126. The adhesive layer includes a central layer 134 of a polyimide thermal barrier and an external layer 132, 134 on either side of the polyimide of a ceramic coating, such as AlN.

A continuous ceramic coating may be applied to the entire polyimide surface. This may be done in any of a variety of different ways including with magnetron sputtering. This thermal barrier structure may provide better thermal insulation and higher adhesion than the epoxy-based barrier because the ceramic layer is spread across the entire polyimide thermal barrier material.

The described thermal barrier may be used in any of a variety of tools that use a thermal barrier between two layers that benefit from a very high bond strength between ceramics and metallic alloys and that benefit from stability over a wide range of temperatures. One such tool is a thermal head used to test an integrated circuit under precise temperature control. In such a thermal head, a thermal barrier (or thermally insulating layer) is needed to quickly switch between low and high temperatures. The thermal insulation and bond strength allows such a tool to survive reliability stresses. The stresses are increased with high speed and high performance heaters. Such thermal heads may be used in die sort and test tools as well as for other tools for which high performance heaters are used.

Figure 3:
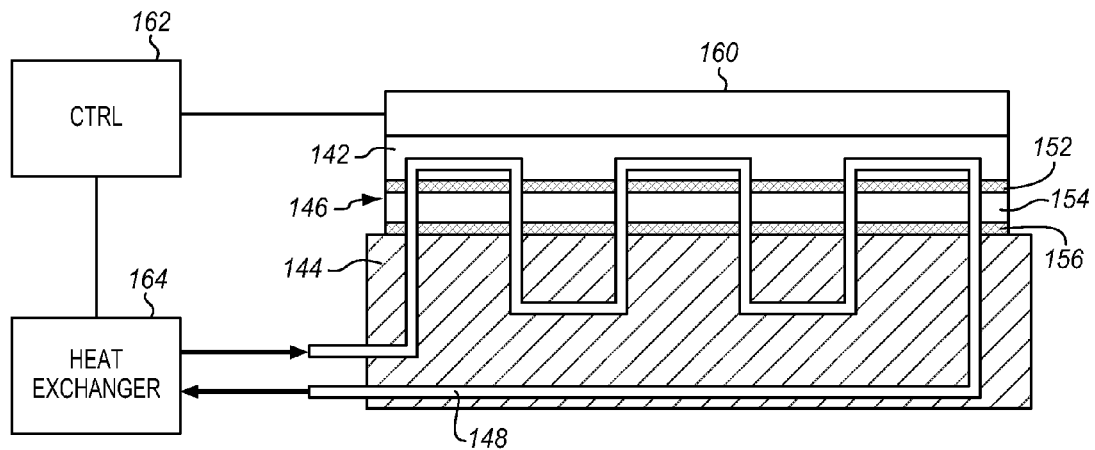
FIG. 3 is a partial cross-sectional side view diagram of a thermal test head including a thermal stage according to an embodiment.

FIG. 3 is a partial cross-sectional side view diagram of a thermal test head. The thermal head has a top ceramic heater layer 142. The ceramic heater layer is attached to a metal base plate 144 by a thermal barrier layer 146. As in the examples above, the thermal barrier is a composite three layer 152, 154, 156 structure. Any of the described composite structures described above may be used. The thermal head also has a fluid channel 148 that circulates a hot or cold fluid through the thermal head and into the top layer 142. A hot fluid is pumped through the top layer to heat a DUT (Device Under Test) and a cold fluid is pumped through the top layer to cool the DUT. The top plate may be heated and cooled only by the fluid or it may also contain electrical resistive heaters (not shown) to provide more or faster heating to the DUT.

A socket or connector 160 is mounted over the top plate to hold an integrated circuit die or package which is the DUT (not shown). The configuration may be adapted to suit the particular DUT. The die may be bare or it may be packaged, depending on the particular implementation. The socket includes an electrical connection to pads, lands, or contacts on the die. These electrical connections can be connected to a central test controller 162. The controller is also coupled to a heat exchanger 164 which heats or cools the liquid or both. The heat exchanger may include a pump, filters, valves, pressure controllers and other components to control the flow of the coolant or heating fluid. The heat exchanger drives the fluid through the fluid channels of the thermal head. The circulated fluid returns to the heat exchanger where it is heated or cooled and pumped back through the system. While only one socket is shown, many dies may be tested simultaneously. The controller and heat exchanger may be shared with many different DUTs. The thermal head may be used as a die sort tool, function tester, or for any of a variety of other types of tests.

Figure 4:
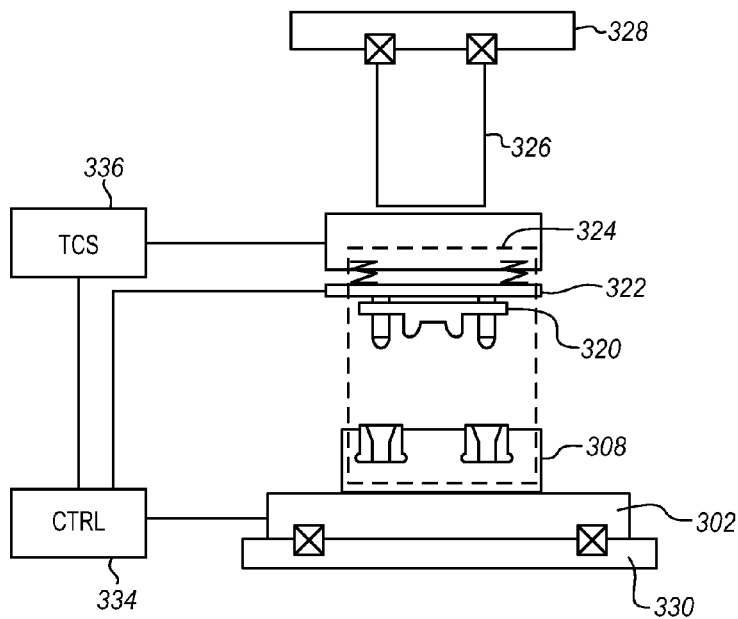
FIG. 4 is a side view diagram of a test fixture using the test socket of FIG. 11 according to an embodiment.

FIG. 4 is a side plan view diagram of a test fixture including a socket and a DUT. The socket body and frame are integrated into a bottom side contact 308 with alignment guides 309. These are mounted on a printed circuit board 302 that is mounted to a bottom plate 330. The DUT (not shown) is mounted to a top side contact 320 that includes guide pins 321 that mate with the alignment guides of the socket. The top side contact is pressed against the bottom side contact with a pusher plate 322. The pusher plate is within a thermal control unit (TCU) head 324, such as that of FIG. 1 or FIG. 2. The TCU head is attached to a TCU mount 326 that is attached to a top plate 328. Moving the top plate drives the TCU mount and the TCU head down toward or up away from the socket. The pusher plate 322 provides a stiffening reinforcement to press the DUT against the many plungers.

In addition to a pusher plate and connections to the top side connector 320, the TCU head also has a thermal control system 336, such as heaters, coolers, or both to regulate the temperature of the DUT during test. The TCU and the bottom side PCB are coupled to a controller 334 to control test signals, thermal conditions, power supply and other aspects of testing the DUT.

Figure 5:
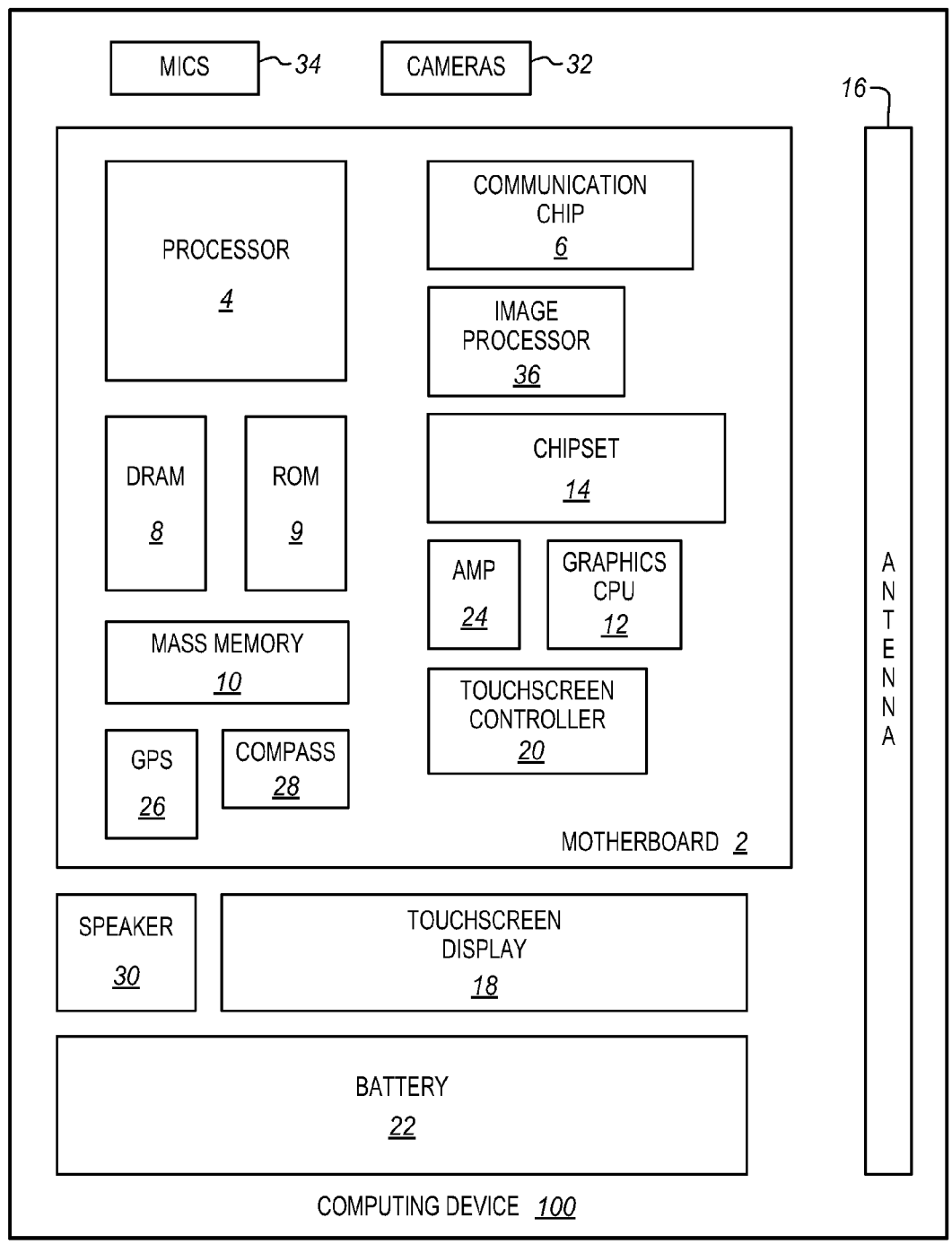
FIG. 5 is a block diagram of a computing device suitable for use with embodiments.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM) 508, non-volatile memory (e.g., ROM) 509, flash memory (not shown), a graphics processor 512, a digital signal processor (not shown), a crypto processor (not shown), a chipset 514, an antenna 516, a display 518 such as a touchscreen display, a touchscreen controller 520, a battery 522, an audio codec (not shown), a video codec (not shown), a power amplifier 524, a global positioning system (GPS) device 526, a compass 528, an accelerometer (not shown), a gyroscope (not shown), a speaker 530, a camera 532, and a mass storage device (such as hard disk drive) 510, compact disk (CD) (not shown), digital versatile disk (DVD) (not shown), and so forth). These components may be connected to the system board 502, mounted to the system board, or combined with any of the other components.

The communication chip 506 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the packages that include the processor, memory devices, communication devices, or other components may be tested and assembled using thermal heads as described herein, if desired. The computing device may also be used as the controller 334 when outfitted with suitable interfaces. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments may be adapted to be used with a variety of formats and configurations for thermal heads using various types of processing and testing equipment for different implementations. References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, the specific location of elements as shown and described herein may be changed and are not limited to what is shown. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus that includes a ceramic heater configured to carry an integrated circuit die, a metal base, and a thermal barrier between the heater and the base.

In further embodiments the thermal barrier comprises an epoxy sheet.

In further embodiments the epoxy sheet includes thermally conductive ceramic fillers.

In further embodiments the epoxy sheet includes metallic alloys fillers.

In further embodiments the thermal barrier comprises a first adhesive layer between the epoxy sheet and the ceramic heater and a second adhesive layer between the epoxy sheet and the metal base.

Further embodiments include a surface treatment on the metal base to improve adhesion to the thermal barrier.

In further embodiments the thermal barrier comprises molded epoxy that has an aliphatic chemistry.

In further embodiments the thermal barrier comprises molded epoxy filled with silica.

In further embodiments the thermal barrier comprises molded epoxy that is exposed to an oxygen plasma.

In further embodiments the thermal barrier comprises a ceramic coating adjacent the ceramic heater, a ceramic coating adjacent the metal base, and a polyimide between the ceramic coatings.

Further embodiments include an electrical integrated circuit connector over the ceramic heater to connect to an integrated circuit to test the integrated circuit through different thermal loads while being heated by the ceramic heater.

Further embodiments include fluid channels through the metal base to control the temperature of the ceramic heater.

In further embodiments the integrated circuit die is in a package.

Some embodiments pertain to an integrated circuit package test system that includes a heater plate having fluid channels to carry a fluid to control the temperature of the heater plate, an integrated circuit package socket on the heater plate to carry a packaged integrated circuit die, a base plate to support the heater plate, a composite thermal barrier attached to the heater plate and to the base plate, and a test controller coupled to the socket to drive the packaged integrated circuit die during a test.

In further embodiments the thermal barrier comprises a ceramic coating adjacent the heater plate, a ceramic coating adjacent the base plate, and a polyimide between the ceramic coatings.

In further embodiments the thermal barrier comprises an adhesive adjacent the heater plate, an adhesive adjacent the base plate, and a silica filled epoxy sheet between the ceramic coatings.

Further embodiments include a heat exchanger connected to the fluid channels to control the temperature of a fluid in the fluid channels.

Some embodiments pertain to a method that includes placing a packaged integrated circuit die into a socket, the socket being on a heater plate, the heater plate being supported by a base plate and attached to the base plate by a composite thermal barrier, controlling the temperature of the heater plate using a fluid in fluid channels of the heater plate, and applying test signals to the die through the socket.

In further embodiments controlling the temperature comprises heating a fluid in a heat exchanger and driving the fluid through the fluid channels.

In further embodiments the composite thermal barrier comprises an adhesive adjacent the heater plate, an adhesive adjacent the base plate, and a silica filled epoxy sheet between the ceramic coatings.

What is claimed is:

1. An apparatus comprising:
    a ceramic heater configured to carry an integrated circuit die after having been diced for thermal test;
    a metal base;
    a composite thermal barrier having at least three layers between the heater and the base, wherein the thermal barrier comprises a ceramic coating adjacent the ceramic heater, a ceramic coating adjacent the metal base, and a polyimide between the ceramic coatings; and
    fluid channels in the metal base, extending through the composite thermal barrier, and in the ceramic heater.

2. The apparatus of claim 1, wherein the thermal barrier comprises an epoxy sheet.

3. The apparatus of claim 2, wherein the epoxy sheet includes thermally conductive ceramic fillers.

4. The apparatus of claim 2, wherein the epoxy sheet includes metallic alloy fillers.

5. The apparatus of claim 2, wherein the thermal barrier comprises a first adhesive layer between the epoxy sheet and the ceramic heater and a second adhesive layer between the epoxy sheet and the metal base.

6. The apparatus of claim 1, further comprising a surface treatment on the metal base to improve adhesion to the thermal barrier.

7. The apparatus of claim 1, further comprising an electrical integrated circuit connector over the ceramic heater to connect to the integrated circuit die to test the integrated circuit die through different thermal loads while being heated by the ceramic heater.

8. The apparatus of claim 1, wherein the fluid channels control the temperature of the ceramic heater.

9. The apparatus of claim 1, wherein the integrated circuit die is in a package.

10. An integrated circuit package test system comprising:
    a heater plate having fluid channels to carry a fluid to control the temperature of the heater plate;
    an integrated circuit package socket on the heater plate to carry a packaged integrated circuit die;
    a base plate to support the heater plate;
    a composite thermal barrier having at least three layers attached to the heater plate and to the base plate, wherein the fluid channels of the heater plate extend through the at least three layers of the composite thermal barrier, and are in the base plate, wherein the thermal barrier comprises a ceramic coating adjacent the heater plate, a ceramic coating adjacent the base plate, and a polyimide between the ceramic coatings; and a test controller coupled to the socket to drive the packaged integrated circuit die during a test.

11. The system of claim 10, further comprising a heat exchanger connected to the fluid channels to control the temperature of a fluid in the fluid channels.

12. A method comprising:

placing a packaged integrated circuit die into a socket, the socket being on a heater plate, the heater plate being supported by a base plate and attached to the base plate by a composite thermal barrier having at least three layers between the heater plate and the base plate, wherein the thermal barrier comprises a ceramic coating adjacent the heater plate, a ceramic coating adjacent the base plate, and a polyimide between the ceramic coatings;

controlling the temperature of the heater plate using a fluid in fluid channels of the heater plate, wherein the fluid channels of the heater plate extend through the at least three layers of the composite thermal barrier, and are in the base plate; and applying test signals to the die through the socket.

13. The method of claim 12, wherein controlling the temperature comprises heating a fluid in a heat exchanger and driving the fluid through the fluid channels.

* * * * *